US012731756B2

(12) United States Patent
Tavabi et al.

(10) Patent No.: US 12,731,756 B2
(45) Date of Patent: Sep. 8, 2026

(54) MAGNETIZATION DEVICE FOR AN ELECTRON MICROSCOPE AND METHOD

(71) Applicant: FORSCHUNGSZENTRUM JÜLICH GMBH, Jülich (DE)

(72) Inventors: Amir Hossein Tavabi, Jülich (DE); Helmut Soltner, Inden (DE); Michael Schaaf, Herzogenrath (DE); Maximilian Kruth, Bedburg (DE); Rafal Edward Dunin-Borkowski, Jülich (DE)

(73) Assignee: FORSCHUNGSZENTRUM JÜLICH GMBH, Jülich (DE)

( * ) Notice: Subject to any disclaimer, the term of this patent is extended or adjusted under 35 U.S.C. 154(b) by 350 days.

(21) Appl. No.: 18/578,561

(22) PCT Filed: Aug. 20, 2021

(86) PCT No.: PCT/EP2021/073100
§ 371 (c)(1),
(2) Date: Jan. 11, 2024

(87) PCT Pub. No.: WO2023/020700
PCT Pub. Date: Feb. 23, 2023

(65) Prior Publication Data
US 2024/0258064 A1 Aug. 1, 2024

(51) Int. Cl.
*H01J 37/20* (2006.01)
*H01J 37/14* (2006.01)
*H01J 37/147* (2006.01)

(52) U.S. Cl.
CPC .......... *H01J 37/20* (2013.01); *H01J 37/1471* (2013.01); *H01J 2237/2001* (2013.01); *H01J 2237/2802* (2013.01)

(58) Field of Classification Search
CPC .................. H01J 37/20; H01J 37/1471; H01J 2237/2001; H01J 2237/2802
See application file for complete search history.

(56) References Cited

U.S. PATENT DOCUMENTS

2018/0269031 A1* 9/2018 Stanislav ............. H01J 37/244

* cited by examiner

*Primary Examiner* — Nicole M Ippolito
(74) *Attorney, Agent, or Firm* — Dickinson Wright PLLC

(57) ABSTRACT

The disclosure refers to a magnetization device, and an associated method of operation, for an electron microscope that includes a coil, with a yoke carrying the coil, with a sample holder for holding a sample, and with two poles of the yoke adjoining the sample holder. A gap is present in the yoke between each pole and the coil. A sample is placed on the sample holder by means of an optical microscope and subsequently the part of the magnetization device comprising the sample holder is connected to the part of the magnetization device comprising one or more coils.

19 Claims, 5 Drawing Sheets

MAGNETIZATION DEVICE FOR AN ELECTRON MICROSCOPE AND METHOD

CROSS-REFERENCE TO RELATED APPLICATION(S)

This present application is a national stage application of International Patent Application No. PCT/EP2021/073100, filed Aug. 20, 2021, the disclosure of which is hereby incorporated by reference in its entirety.

BACKGROUND

The disclosure refers to a magnetization device for an electron microscope and a method.

SUMMARY

An electron microscope is a microscope that uses a beam of accelerated electrons as a source of illumination. Electron microscopes use shaped magnetic fields to form electron optical lens systems.

In high-resolution transmission electron microscope (HR-TEM), thin samples of a material are penetrated by a focused electron beam with energies of several 100 kV. The electrons scattered from the sample are collected. The resulting scattering pattern in the detector allows conclusions to be drawn about the atomic structure of the sample. In the early days of electron microscopy, the imaging properties of electron microscopic optics were continuously improved to correct for image errors. For several years, the focus has been on more accurate examination of samples in electric and magnetic fields. These fields change the microscopic properties of the sample. Samples can therefore be examined for their suitability for magnetic storage media, for example.

When magnetic fields are applied to the sample, their amplitude and direction play a role during the examination. An electron microscope includes a holder for holding a sample. The holder should make it possible to adjust the magnetic field and its direction at the location of the sample with the help of coils or permanent magnets. It should be possible to continuously change the orientation of the sample over a wide range of angles. Coils can include a magnetic core.

The application of magnetic fields to the sample is not without problems from an electron microscopy point of view, because the magnetic field cannot be concentrated in the thin layer of the sample. Instead, it spreads out in a larger area around the sample starting from the field-generating objects. The electron beam of the electron microscope reacts to this field area with an undesired deflection. The deflection can only be compensated within certain limits in the electron microscope if the sample holder generates additional counter fields near the sample. The additional counter fields are intended to guide the trajectories of the electrons back in the original direction.

Generating the magnetic fields using coils is the more flexible method compared to the permanent magnet option because it is the easiest to change the magnetic fields in terms of amplitude and polarity. In addition, magnetic fields can then be turned off. Electromagnets in the vicinity of the sample can, however, heat the sample to a disadvantage. Cooling is then required. Liquid nitrogen or liquid helium can be used as cooling medium. Nevertheless, an undesired heating of the sample during the examination cannot be excluded.

A magnetization device is known from G. Yi et al. (https://doi.org/10.1016/S0304-3991(03)00148-7), T. Uhlig et al. (https://doi.org/10.1016/S0304-3991(02)00264-4), M. Arita et al. (https://www.jstage.jst.go.jp/article/matertrans/55/3/55_MD201310/_pdf/-char/en), Tsuneta et al. (https://doi.org/10.1093/jmicro/dfu030) and Sugarawa et al. (https://doi.org/10.1016/j.ultramic.2018.11.012).

The disclosure is intended to allow a sample to be examined with an electron microscope. The sample should be able to be in a magnetic field during the examination. It should be possible to adjust the magnetic field. The sample should not be heated by the generation of the magnetic field.

One problem is that there is little installation space available for a magnetization device. A magnetization device can therefore be only a few millimetres thick in order to be inserted into a standard electron microscope.

To achieve one or more of the above aims, a magnetization device for an electron microscope comprises the features of the first claim. The dependent claims refer to preferred embodiments.

The magnetization device for an electron microscope comprises a coil and a yoke carrying the coil. The magnetization device comprises a sample holder for holding a sample. Two poles of the yoke are adjacent to the sample holder. A first gap is present in the yoke between the first pole and the coil. A second gap is present in the yoke between the second pole and the coil.

A coil is an electrical conductor such as a wire in the shape of a coil, spiral or helix. When an electric current flows through the electrical conductor, a magnetic field is generated. The electrical conductor of the coil can be connected to an electrical power source. Electrical connectors may be present to allow the coil to be connected to a power source.

A yoke is a piece of ferromagnetic material like iron. The yoke passes through the coil. Magnetic field lines are directed to the sample through the yoke. To be able to achieve this, the poles of the yoke are adjacent to the sample holder. If an electric current flows through the coil, then one pole will be a magnetic south pole or a magnetic north pole. Due to the poles, a sample on the sample holder can be in a magnetic field that is generated by the coil.

The sample holder can be a rod on which a sample can be placed. For example, the cross-section of the rod can be round or square. The sample holder can be made of a non-magnetizable material such as glass or sapphire. If the sample holder is made of sapphire, then it can be cooled particularly well at low temperatures. Low temperature means temperatures of a few 10 Kelvin such as 40 Kelvin.

Each gap mechanically interrupts the yoke. Consequently, the yoke consists of at least three parts. A gap interrupts the flow of heat from the coil to the poles. This avoids a sample from heating up due to electric current flowing through the coil. This helps prevent a sample from heating up due to electric current flowing through the coil. Further, the gap decouples two parts. A transfer of vibrations is avoided. Since it is only a gap, the magnetic flux to the poles is hardly impeded. A sample can therefore be in a magnetic field generated by a coil. However, heat generated by the coil is avoided from reaching the sample.

The magnetisation device is mainly intended for electron microscopes. However, the magnetisation device can be used well for other devices. For example, the device according to the disclosure can also be used in the case of X-ray diffraction or neutron scattering in order to be able to study properties of the sample as a function of magnetic fields. The magnetisation device according to the disclosure can therefore be used generally in imaging examination methods. The device according to the disclosure is then suitably inserted into corresponding imaging devices. Analyses carried out with the aid of particle scattering are also suitable applications for the magnetisation device. The magnetisation device according to the disclosure can be used in systems using other particle beams like ions, neutrons, photons like x-rays and atoms.

In a preferred embodiment, the sample holder is rotatably mounted. A sample can therefore be rotated, at least relative to an electron beam, when the sample is examined using an electron microscope. It may be that the sample can also be rotated relative to the magnetic field in which the sample is located during an examination. It may be possible to rotate the sample along with one or more poles of the yoke during an examination. In all cases, rotating allows the sample to be examined in more detail.

In a preferred embodiment, the device is configured so that rotation of the sample holder does not cause the width of a gap to change. This ensures that a magnetic field to which the sample is exposed does not change significantly due to a changing gap width. More reliable examination results are thus obtained.

In a preferred embodiment, the yoke has three poles. Each pole is adjacent to the sample holder. A coil is associated with each pole. If there are three poles, then there are therefore also three coils. The magnetization of a pole can be adjusted by the associated coil. So, one pole can be a magnetic north pole during the examination of the sample. The other two poles can then be magnetic south poles. However, it is also possible that one pole is a magnetic south pole during the examination of the sample. The other two poles can then be magnetic north poles. This embodiment of the disclosure therefore allows to change the magnetic field in which the sample is located during the examination of the sample.

Two poles are preferably adjacent to the sample holder on opposite sides. A third pole is preferably adjacent to one end of the sample holder. A magnetic field can then be modified in a particularly suitable way to allow a sample to be studied in particular detail.

However, the three poles can, for example, also be evenly distributed around the location of the sample holder that is intended for holding a sample. The location intended for holding a sample can be a free end of an elongated sample holder.

In the case of three poles, a magnetic field can be generated that can rotate in a plane. In one embodiment, the yoke may comprise four poles arranged so that a magnetic field can be changed three-dimensionally. Each pole can then be associated with its own coil. For example, the four poles may be arranged tetrahedrally around the location intended for the attachment of a sample.

It is not excluded to have more than four poles and more than four associated coils to be able to expose a sample to desired magnetic fields. As a rule, however, three poles and their associated coils are sufficient to be able to investigate magnetic field-dependent properties of a sample to a suitable extent.

In a preferred embodiment, there is a gap in the yoke between each pole and the respective associated coil. Therefore, there are three gaps when there are three poles. There are four gaps when there are four poles. The poles are then separated from the coils by the gaps in such a way that a flow of heat from the coils to the poles is impeded. Heating of a sample is thus avoided in an improved manner.

In a preferred embodiment, a gap separating a pole from its coil is container-shaped. The piece of the yoke that encloses the pole may then extend into a container shape recess of a first part of the yoke. The piece of the yoke that includes the pole can be at least indirectly fixed to the sample holder by a non-magnetic material. The construction can thus be stabilized. The sample holder can be easily separated from the part of the yoke comprising the coils.

A gap separating a pole from its coil can be shaped like a flat plane.

In a preferred embodiment, a gap separating an outer pole from its coil is rectilinear in cross-section. A gap formed in this way keeps the manufacturing effort low.

In a preferred embodiment, a gap separating an outer pole from its coil is rotationally symmetric with respect to the rotation axis of the sample holder. Preferably, all gaps are rotationally symmetric with respect to the rotation axis of the sample holder.

The yoke may comprise three bars. Each bar may carry a coil. A yoke formed in this way keeps the manufacturing effort low.

In a preferred embodiment, the yoke comprises four parts. The four parts are separated from each other, for example, by gaps. Parts of the yoke can then be rotated together with the sample holder. In addition, heat generated by one or more coils can be shielded.

Four separate parts of the yoke are present, especially when the yoke has three poles. Five separate parts of the yoke may be present if the yoke comprises four poles.

A separated part of the yoke can consist of several pieces that are connected to each other. However, a separated part of the yoke may also have been manufactured in one piece and consequently consist of only one piece.

In a preferred embodiment, parts of the yoke can be rotated together with the sample holder. A sample can then be examined in particular detail with the aid of an electron microscope.

In a preferred embodiment, a part of the yoke carrying one or more coils is separable from the sample holder. If the sample holder is separated from the part of the yoke with the coils, then a sample can easily be placed very accurately on the sample holder using an optical microscope.

In a preferred embodiment, there are two outer yokes, each carrying a coil and facing each other. Magnetic counter fields can then be generated that can correct a trajectory of the electron beam of an electron microscope as needed.

In a preferred embodiment, a passage for an electron beam is provided in such a way that a sample held by the sample holder can be microscoped by the electron beam. The passage for an electron beam may pass through the two outer yokes. The two outer yokes can therefore also have a gap as a part of the passage.

In a preferred embodiment, the thickness of a section of the magnetizing device is less than 20 mm, preferably less than 10 mm. The section comprises the sample holder. The magnetizing device can then be inserted into common electron microscopes.

In a preferred embodiment, the thickness of the one or more gaps is less than 0.5 mm, preferably less than 0.2 mm. Such thin gaps are sufficient to be able to shield heat. Nevertheless, a magnetic flux can pass suitably well the gaps.

In a preferred embodiment, the magnetizing device comprises one or more heat sinks formed from copper or aluminium. The one or more heat sinks can be cooled. It can thus be improved to avoid heating a sample in a disturbing way during an examination.

Copper or aluminium are good heat conductors and non-magnetic. Therefore, these materials are well suited. AlN is a further suitable material.

In a preferred embodiment, the one or more yokes consist of permalloy and/or Vacoflux®. The materials have a very high magnetic permeability. A magnetic flux can therefore be conducted well. Particularly good measurement results can then be obtained. Other materials with similar magnetic permeability can also be used.

In a preferred embodiment, an electron microscope comprises the magnetizing device. The magnetizing device can be located between two poles of the electron microscope. The trajectory of an electron beam may pass through the poles. The distance between the poles may be small, for example, no more than 40 mm or no more than 30 mm. The poles may be parts of a yoke carrying a coil for generating a magnetic field. The electron microscope may have a heat sink with two tongues to allow cooling of the environment of the sample to be examined. The heat sink can consist of copper or aluminium. The sample holder may be located at least partially between the tongues of the heat sink. The distance between the tongues can be smaller than the distance between the two poles of the electron microscope. The ends of the tongues can then lie between the poles of the electron microscope.

The disclosure also refers to a method of operation of the magnetization device. At least a part of the yoke carrying one or more coils is separated from a part of the magnetization device comprising the sample holder. A sample is placed on the sample holder by means of an optical microscope and subsequently the part of the magnetization device comprising the sample holder is connected to the part of the magnetization device comprising one or more coils. An optical microscope microcopies with the aid of light. The optical microscope allows very small samples to be placed very precisely on the sample holder. The use of an optical microscope is possible because the magnetization device includes two parts that can be easily detached from each other.

BRIEF DESCRIPTION OF THE DRAWINGS

The disclosure is explained in more detail below with the aid of figures.

DETAILED DESCRIPTION

Figure 1:
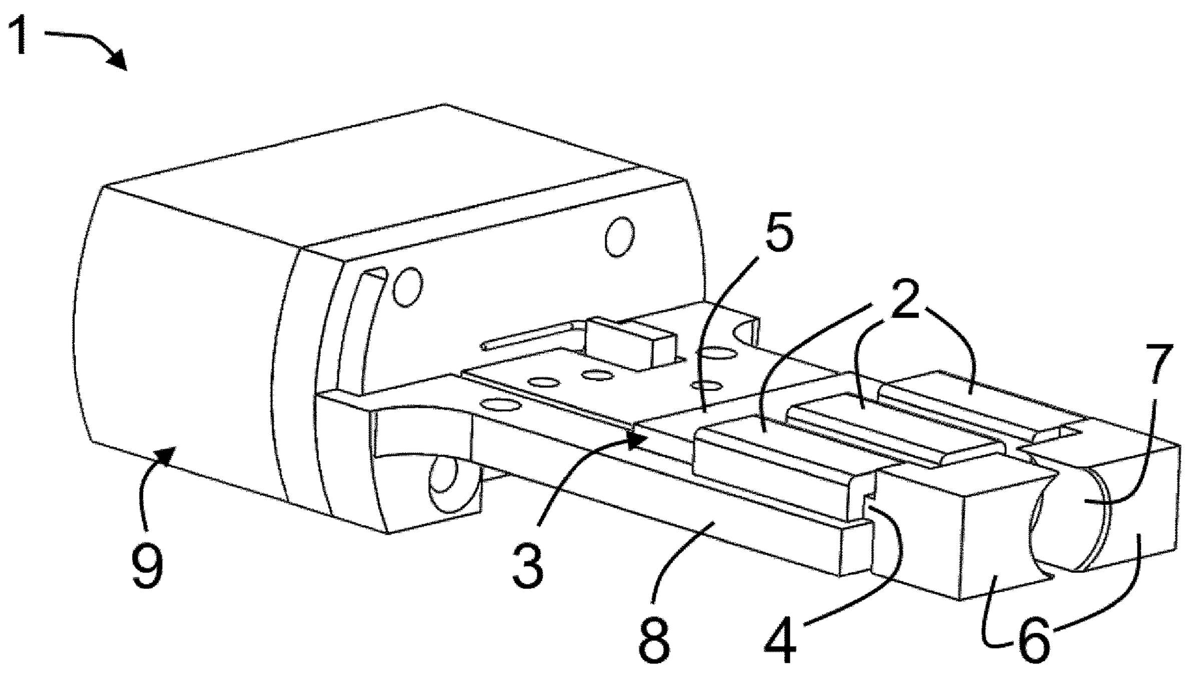
FIG. 1 shows a view of a first part of a magnetization device.

FIG. 1 shows a view of a first part 1 of a magnetization device for an electron microscope. There are three coils 2 and a first part 3 of a yoke. The first part 3 of the yoke carries the coils 2. Each bar 4 passes through the core of a coil 2. One end of each bar joins a base 5 of the yoke. Two outer bars 4 are each connected to a head piece 6. The head pieces extend towards each other. The opposing surfaces 7 of the head pieces 6 are concave.

The first part 4, 5, 6 of the yoke may have been made from one piece, for example by milling. However, the bars 4, the base 5 and the head pieces 6 may also have been manufactured individually and subsequently joined together. A plate 8 of a heat sink 9 may carry the first part 4, 5, 6 of the yoke and the coils 2. The plate 8 may consists of copper and thus of a material which that is non-magnetic and a good conductor of heat.

Figure 2:
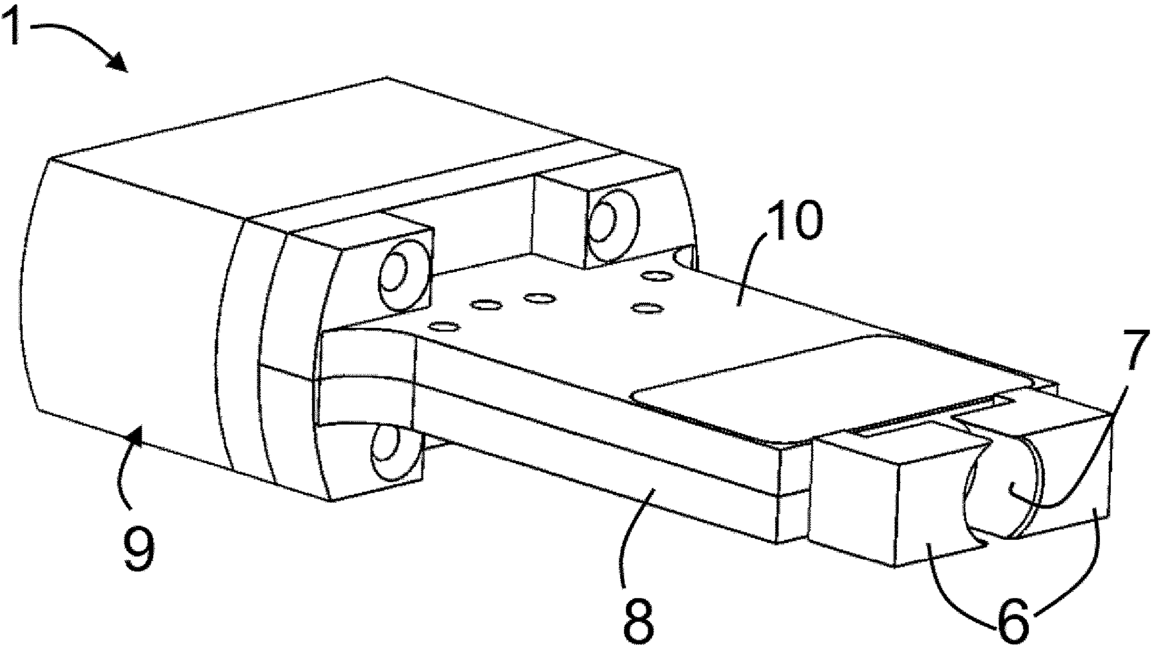
FIG. 2 shows a further view of the first part of the magnetization device.

FIG. 2 shows the first view of the first part 1 of the magnetization device. In contrast to FIG. 1, a cover plate 10 covers most of the first part 3 of the yoke and the coils. The cover plate 10 may be attached to the plate 8 and/or to further parts of the heat sink 9 for example by screws. The cover plate may also consist of copper. The heat sink 9 may include one or more internal channels. A cooling fluid can flow through the channels to keep the heat sink cool.

Figure 3:
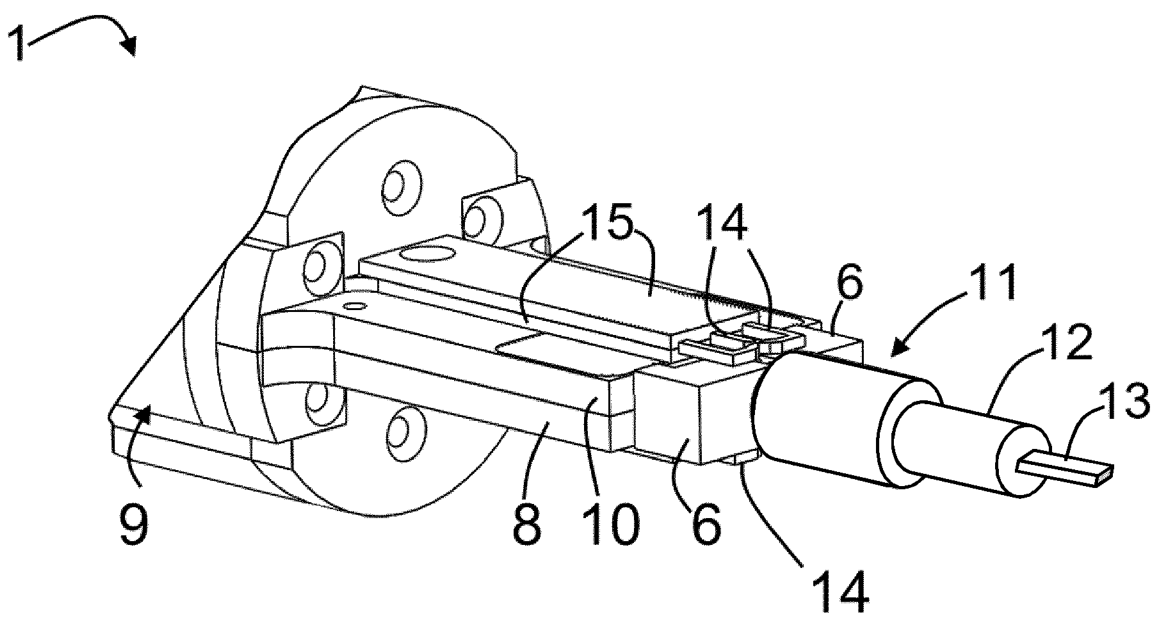
FIG. 3 shows the first part of the magnetization device together with the second part of the magnetization device.

FIG. 3 shows the first part 1 of the magnetization device together with the second part 11 of the magnetization device. The second part 11 of the magnetization device has been inserted into the first part 1 of the magnetization device. The second part 11 of the magnetization device can therefore be pulled out of the first part 1 of the magnetization device. Connecting means may be present to allow the two parts 1, 11 of the magnetization device to be firmly connected to each other. For example, a clamp can be present as a connecting means. The two parts 1, 11 of the magnetization device can be connected to each other by a snap-in connection so that they cannot accidentally detach from each other.

The second part 11 may comprise a heat sink 12 which consists of copper for example. A rod made of sapphire can extend into the heat sink. If the outwardly projecting end of the rod 13 is cooled, the heat sink 12 is thereby kept cool.

External yokes 14 may be mounted on the first part. The external yokes 14 which pass through coils. One or more yokes 14 and one or more coils may be located at least predominantly between two plates 15. The plates 15 may be part of the heat sink 9. The plates 15 may be made of copper. Two plates 15 may be attached to the cover plate 10 together with a yoke 14 or a pair of yokes 14 and at least one coil. Two plates 15 may be attached to the plate 8 together with a yoke 14 or a pair of yokes 14 and at least one coil. The yokes 14 are then located on opposite sides of the magnetizing device 1, 11. With the help of the magnetic fields that can be generated with the help of the yokes 14, the trajectory of electrons can be corrected, if necessary.

Figure 4:
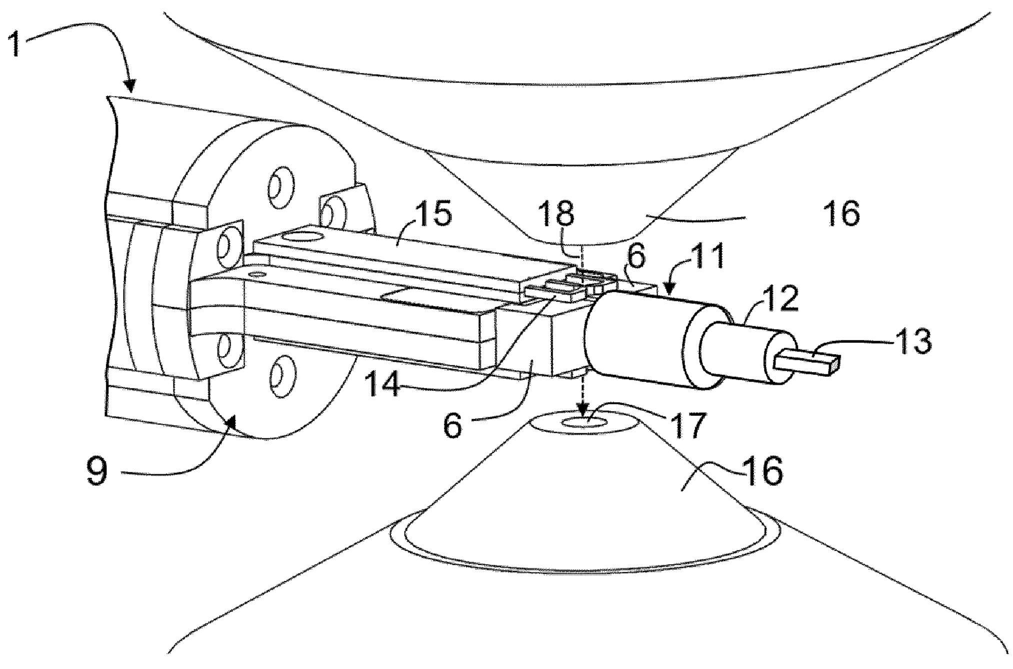
FIG. 4 shows the magnetizing device as part of a high-resolution transmission electron microscope.

FIG. 4 shows how the magnetizing device 1, 11 can be placed between two poles 16 of a high-resolution transmission electron microscope in order to examine a sample by means of an electron beam 18. The two poles include apertures 17 at their faces, and the electron beam 18 exits the aperture of the upper pole 16 and enters the aperture of the lower pole 16. The two poles 16 could be parts of a yoke. The yoke carries a coil.

The distance between the two poles 16 of the high-resolution transmission electron microscope may be, for example, 20 mm to 40 mm. The section of the magnetization device that is placed between the two poles 16 must therefore be correspondingly thinner. The section of the magnetization device that is placed between the two poles 16 of the transmission electron microscope includes the sample holder.

Figure 5:
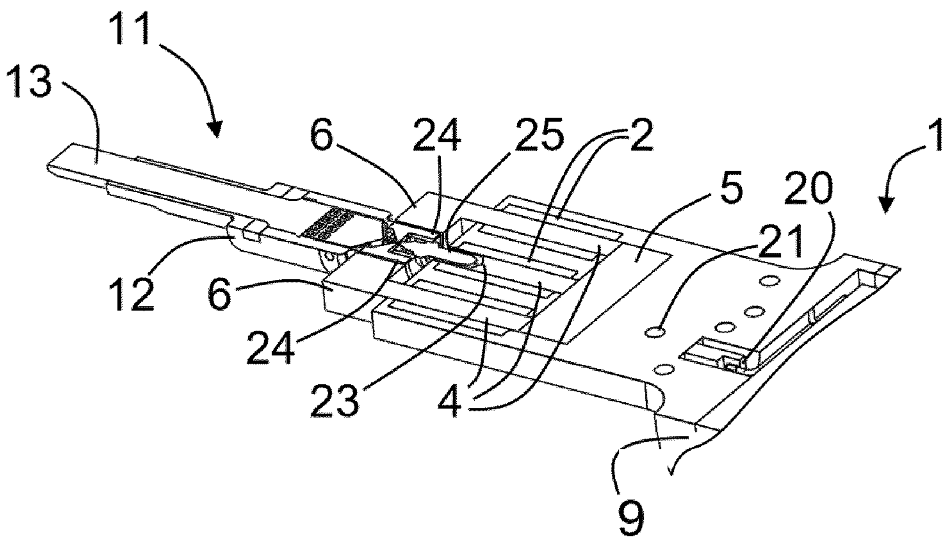
FIG. 5 shows a cross-section of the magnetizing device.

In FIG. 5, a cross-section of the magnetizing device is shown. It can be seen that the first part of the yoke has three bars 4 around which the coils 2 are wound. The bars 4 are attached to the base 5 at one end. The free end of the central bar 4 has a container-shaped recess 23. There is a power supply 20 in the heat sink 9 to the coils 2. There are channels 21 in the heat sink 9. A cooling liquid can be passed through the channels 21. Liquid nitrogen or liquid helium may be the cooling liquid. The heat sink 9 may have a shaft on one end face. The shaft may be inserted into a sleeve so as to rotatably support the first part of the magnetizing device. The connection between the shaft and the sleeve can be torque proof. Then, a rotational movement of the sleeve may be transmitted to the shaft.

The second part 11 of the magnetising device comprises three further parts 24 and 25 of the yoke. The three parts 24 and 25 do not touch. Two parts 24 are opposite each other. The outer sides of the two parts 24 are adjacent to the concave surfaces 7 of the head pieces 6. A concave surface 7 is large compared to the adjacent surface of the portion 24 of the yoke. Thus, each concave surfaces 7 allow a magnetic flux to be transmitted uniformly to the corresponding part 24 of the yoke, independent of rotational movement. There is a gap between each of the concave surfaces 7 of the head pieces 6 and the outer sides of the two parts 24. The gaps may be 0.2 mm wide. The third part 25 is elongated. On the one hand, the third part 25 extends into the two half-shells 24. On the other hand, the third part 25 extends into the container-shaped recess 23. There is a cylindrical gap between the container-shaped recess 23 and the third part 25. The gap can be 0.15 mm thick. There is also a gap between the bottom of the container-shaped recess 23 and the third part 25 of the yoke. This gap can be relatively large and consequently larger than 0.15 mm and also larger than 0.2 mm.

Figure 6:
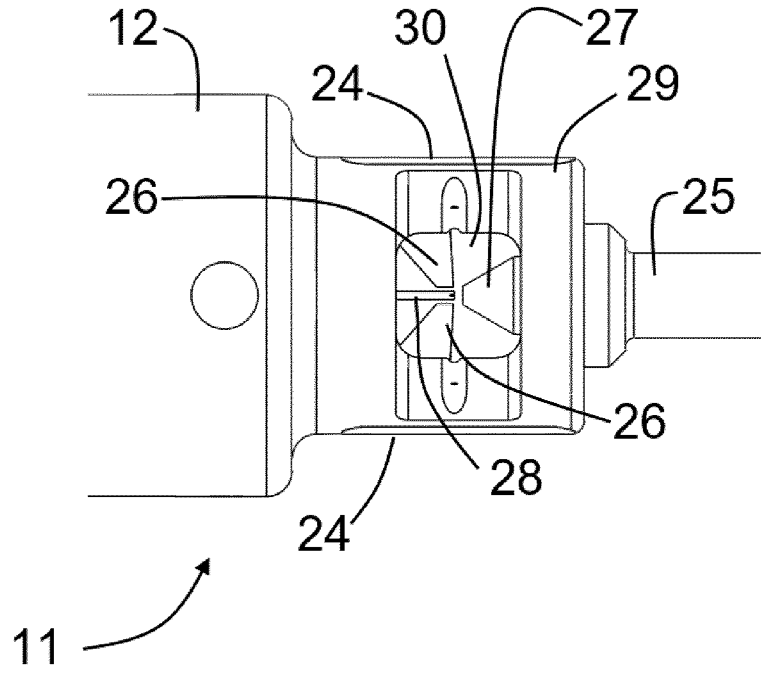
FIG. 6 shows a top view of a section of the second part of the magnetizing device.

FIG. 6 shows a view on a section of the second part 11 of the magnetizing device. The two parts 24 of the yoke have lugs 26 which extend inwardly. The lugs 26 taper to a point. The portion 25 of the yoke includes a tip 27. The lugs 26 and the tip 27 are the three poles of the yoke. The two lugs 26 are laterally adjacent one end of a rod-like sample holder 28. The tip 27 adjoins the end face of the sample holder 28. A magnetic field can be generated between the lugs 26 and the tip 27. A sample located on the end of the sample holder 28 may therefore be in a strong magnetic field.

The heat sink 12 has a head piece 29 which holds the three parts 24 and 25 of the yoke and the sample holder 28. The head piece 29 has a through hole 30 for an electron beam.

Figure 7:
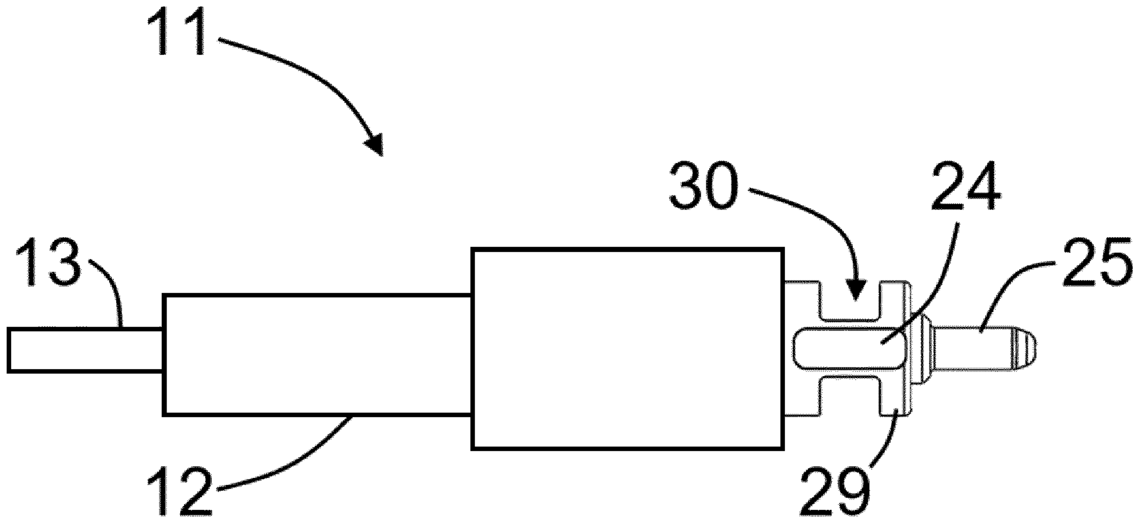
FIG. 7 shows a view on the second part, of the magnetizing device, wherein the view is rotated by 90° compared to the view in FIG. 6.

FIG. 7 shows a view on the second part 11 of the magnetizing device. This view is rotated by 90° compared to the view in FIG. 6.

Figure 8:
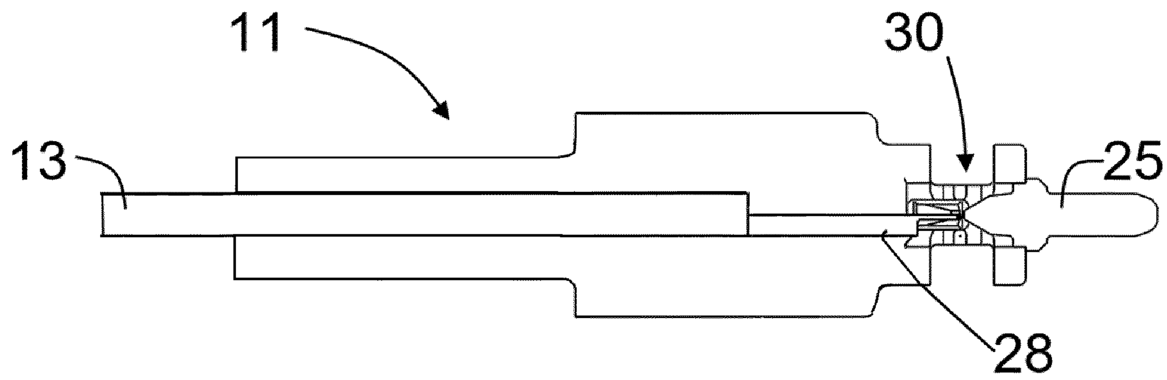
FIG. 8 shows a section through the second part of the magnetizing device.

FIG. 8 shows a section through the second part 11 of the magnetizing device. It is made clear which parts can be mounted and how.

Figure 9:
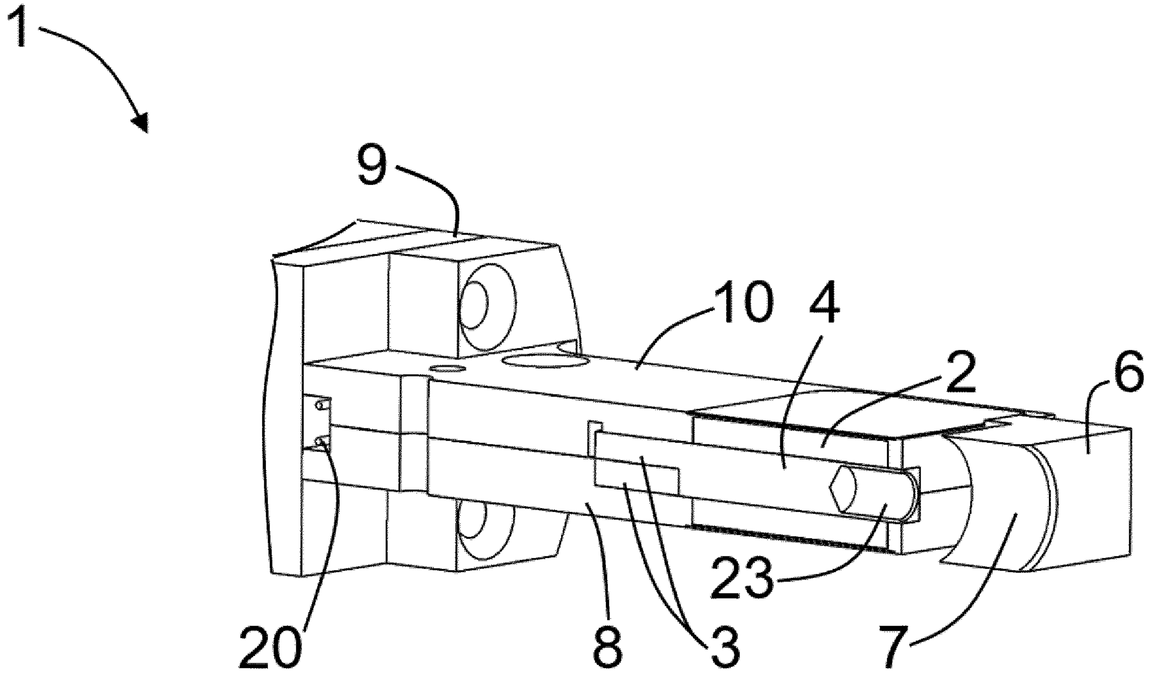
FIG. 9 shows a section through the first part of the magnetizing device.

FIG. 9 shows a section through the first part 1 of the magnetizing device. It is made clear which parts can be mounted and how.

The invention claimed is:

1. A magnetization device comprising: a coil, a yoke carrying the coil, a sample holder for holding a sample, and two poles of the yoke adjoining the sample holder, wherein a gap is present in the yoke between each pole and the coil, and wherein the sample holder is rotatably mounted.

2. The magnetization device according to claim 1, wherein a part of the yoke carrying the coil is separable from the sample holder.

3. The magnetization device according to claim 1, wherein there are two outer yokes, each carrying a coil and facing each other.

4. The magnetization device according to claim 1, wherein a passage for an electron beam is provided in such a way that a sample held by the sample holder can be microscoped by the electron beam, wherein the passage for the electron beam passes through two outer yokes.

5. The magnetization device according to claim 4, wherein the two outer yokes have respective gaps as part of the passage.

6. The magnetization device according to claim 1, wherein a thickness of a section of the magnetizing device is less than 20 mm, wherein the section comprises the sample holder.

7. The magnetization device according to claim 1, wherein a thickness of one or more gaps is less than 0.5 mm.

8. The magnetization device according to claim 1, wherein the magnetizing device comprises a heat sink formed from copper or aluminium.

9. The magnetization device according to claim 1, wherein the magnetization device is comprised within an electron microscope.

10. The magnetization device according to claim 1, wherein the yoke consist of permalloy and/or vacoflux®.

11. A method of operation of a magnetization device, wherein the magnetization device comprises a coil, a yoke carrying the coil, and a sample holder for holding a sample, wherein two poles of the yoke are adjacent to the sample holder, wherein a gap is present in the yoke between each pole and the coil, wherein at least a part of the yoke carrying one or more coils is separated from a part of the magnetization device comprising the sample holder, wherein a sample is placed on the sample holder using an optical microscope and subsequently the part of the magnetization device comprising the sample holder is connected to the part of the magnetization device comprising one or more coils.

12. A magnetization device comprising: a coil, a yoke carrying the coil, a sample holder for holding a sample, and two poles of the yoke adjoining the sample holder, wherein a gap is present in the yoke between each pole and the coil, wherein the yoke has three poles, the three poles being adjacent to the sample holder, and three coils being associated with respective ones of the three poles.

13. The magnetization device according to claim 12, wherein two of the three poles are adjacent to the sample holder on opposite sides and a third pole of the three poles is adjacent to an end of the sample holder.

14. The magnetization device according to claim 12, wherein there is a plurality of gaps in the yoke between the three coils and respective ones of the three poles.

15. The magnetization device according to claim 14, wherein a given gap of the plurality of gaps separating a given pole of the three poles from a corresponding coil of the three coils is container-shaped.

16. The magnetization device according to claim 12, wherein a particular gap separating an outer pole from a particular coil of the three coils is rectilinear in section.

17. The magnetization device according to claim 12, wherein the yoke comprises three bars and each bar carries a coil.

18. The magnetization device according to claim 12, wherein the yoke comprises four parts.

19. The magnetization device according to claim 12, wherein parts of the yoke can be rotated together with the sample holder.

* * * * *